United States Patent
Freidhof

(10) Patent No.: US 8,195,413 B2
(45) Date of Patent: Jun. 5, 2012

(54) MEASURING DEVICE FOR A PREVIEW DISPLAY OF SEVERAL TIME-VARIABLE ELECTRICAL SIGNALS

(75) Inventor: Markus Freidhof, Kirchseeon (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 720 days.

(21) Appl. No.: 12/301,585

(22) PCT Filed: Apr. 26, 2007

(86) PCT No.: PCT/EP2007/003700
§ 371 (c)(1),
(2), (4) Date: Nov. 19, 2008

(87) PCT Pub. No.: WO2007/134697
PCT Pub. Date: Nov. 29, 2007

(65) Prior Publication Data
US 2009/0265126 A1    Oct. 22, 2009

(30) Foreign Application Priority Data
May 22, 2006 (DE) .......................... 10 2006 023 914

(51) Int. Cl.
*G01R 13/00* (2006.01)
*G06F 17/00* (2006.01)
(52) U.S. Cl. ............ 702/68; 702/66; 702/67; 324/76.11
(58) Field of Classification Search .............. 702/66–68
See application file for complete search history.

(56) References Cited

U.S. PATENT DOCUMENTS

| | | | |
|---|---|---|---|
| 6,088,029 A * | 7/2000 | Guiberson et al. | 715/808 |
| 6,229,536 B1 | 5/2001 | Alexander et al. | |
| 6,515,484 B1 * | 2/2003 | Bald et al. | 324/551 |
| 6,525,525 B1 | 2/2003 | Azinger | |
| 6,571,185 B1 | 5/2003 | Gauland et al. | |
| 7,460,967 B2 * | 12/2008 | Duff | 702/67 |

FOREIGN PATENT DOCUMENTS

| | | |
|---|---|---|
| CA | 2050957 A1 | 12/1992 |
| DE | 91 10 348.7 | 11/1991 |
| DE | 101 18 108 A1 | 5/2002 |
| EP | 0 216 414 A1 | 4/1987 |

(Continued)

OTHER PUBLICATIONS

International Preliminary Report on Patentability, PCT/EP2007/003700, Jan. 29, 2009, pp. 1-12.

(Continued)

*Primary Examiner* — Hal Wachsman
(74) *Attorney, Agent, or Firm* — Ditthavong Mori & Steiner, P.C.

(57) ABSTRACT

A measuring device for displaying several time-variable electrical signals. The measuring device includes a front panel, which provides various operating elements, with a screen, which provides several display fields. The first display field provides at least one window, which corresponds to a given measurement channel, where the time-variable electrical signal is presented in this first display field and can be switched as a maximized display to the second display field. For each signal presented in maximized format in the second display field, a status field is then displayed in the corresponding first display field.

20 Claims, 3 Drawing Sheets

FOREIGN PATENT DOCUMENTS

| | | |
|---|---|---|
| EP | 0 267 722 A1 | 5/1988 |
| EP | 0 284 692 B1 | 10/1993 |
| EP | 0 967 487 A2 | 12/1999 |
| JP | 63186153 A | 8/1988 |
| JP | 04175793 A | 6/1992 |
| JP | 2000338139 A | 12/2000 |

OTHER PUBLICATIONS

International Search Report, WO 2007/134697A1, Rohde & Schwarz GmbH & Co. KG, Sep. 20, 2007, pp. 1-6.

* cited by examiner

MEASURING DEVICE FOR A PREVIEW DISPLAY OF SEVERAL TIME-VARIABLE ELECTRICAL SIGNALS

CROSS-REFERENCE TO RELATED APPLICATION

The present application claims priority to PCT Application No. PCT/EP2007/003700, filed on Apr. 26, 2007, and German Patent Application No. 10 2006 023 914.8, filed on May 22, 2006, the entire contents of which are herein incorporated by reference.

BACKGROUND OF THE INVENTION

1. Field of the Invention

The invention relates to a measuring device for the display of several time-variable electrical signals.

2. Discussion of the Background

One disadvantage with the known multi-channel oscilloscopes is that the overall display appears complicated to the user or user-unfriendly as a result of the plurality of measurement signals displayed on the screen.

European patent specification EP 0 284 692 B1 discloses an oscilloscope, which allows a curve to be selected from a plurality of displayed waveforms by means of a touch-screen, wherein these waveforms are called up from a waveform memory. The touch-screen comprises several rows of light sources and light sensors, which are distributed around the edge of the touch-screen, in order to supply to the oscilloscope input data, which relate to a screen position touched by a user's finger. However, the selection of several measurement signals from several measurement channels is not possible.

SUMMARY OF THE INVENTION

The invention is based on the object of providing a measuring device, which provides a user-friendly and logically-organized screen area.

Accordingly, for the display of several time-variable electrical signals, the measuring device according to the invention comprises a front panel with different operating elements, such as control buttons, rotary switches and similar. A screen area with a monitor is provided on the front panel of the measuring device, for example, the oscilloscope. Several display fields are arranged on this monitor. The first display field provides one or more windows, each window corresponding to a measurement channel. The measured, time-variable electrical signals are displayed in a minimized format in the windows of the first display field, which can be switched to a maximized format in the second display field, which can also be referred to as the main screen. With the maximized display on the main screen or respectively in the second display field, a status field is displayed in the corresponding window of the first display field.

The advantages achieved with the invention are that the display in the overall display field is very logically organized and user-friendly, because signals, which are momentarily irrelevant to the user, can be displayed as required in a minimized display field. It is also advantageous that a status field is shown in the smaller windows, so that the user can rapidly access information regarding the current measurement parameters or signal-form attributes.

Furthermore, it is advantageous that the time-variable electrical signals presented in the two display fields are displayed in real time, so that the user is also provided with a preview of the signal displayed in the windows of the first display field. In the event of a significant change in the signal, the user can switch the relevant signal to a maximized format in the second display field.

Moreover, the measuring device according to the invention can provide a touch-screen. This increases user-friendliness, because the user activates or respectively de-activates the various display fields by touching the touch-screen, which triggers a toggle function for the display of the respectively-selected signal.

As an alternative, the operating elements can contain pushbuttons, which are arranged, for example, below the screen area. This arrangement is also very user-friendly, because the functionality of the respective pushbutton relates to that window of the first display field, which is displayed immediately above the pushbutton. Accordingly, by activating the pushbutton, the user can readily identify which signal he has selected for maximized display.

As a further alternative, a mouse function with a mouse pointer which can be displaced on the screen can be provided as an operating element. Accordingly, a signal, which has, for example, just been displayed in the second display field, can easily be selected and marked.

Furthermore, it is advantageous that the touch-screen is provided in addition to the operating elements such as the pushbuttons and mouse function, so that the signals, especially signals presented in the second display field, can also be selected and marked using the touch-screen function.

BRIEF DESCRIPTION OF THE DRAWINGS

Exemplary embodiments of the measuring device according to the invention are explained below with reference to the drawings. The drawings are as follows.

DETAILED DESCRIPTION OF EXEMPLARY EMBODIMENTS OF THE INVENTION

Mutually-corresponding components are marked with the same reference numbers in all of the drawings.

Figure 1:
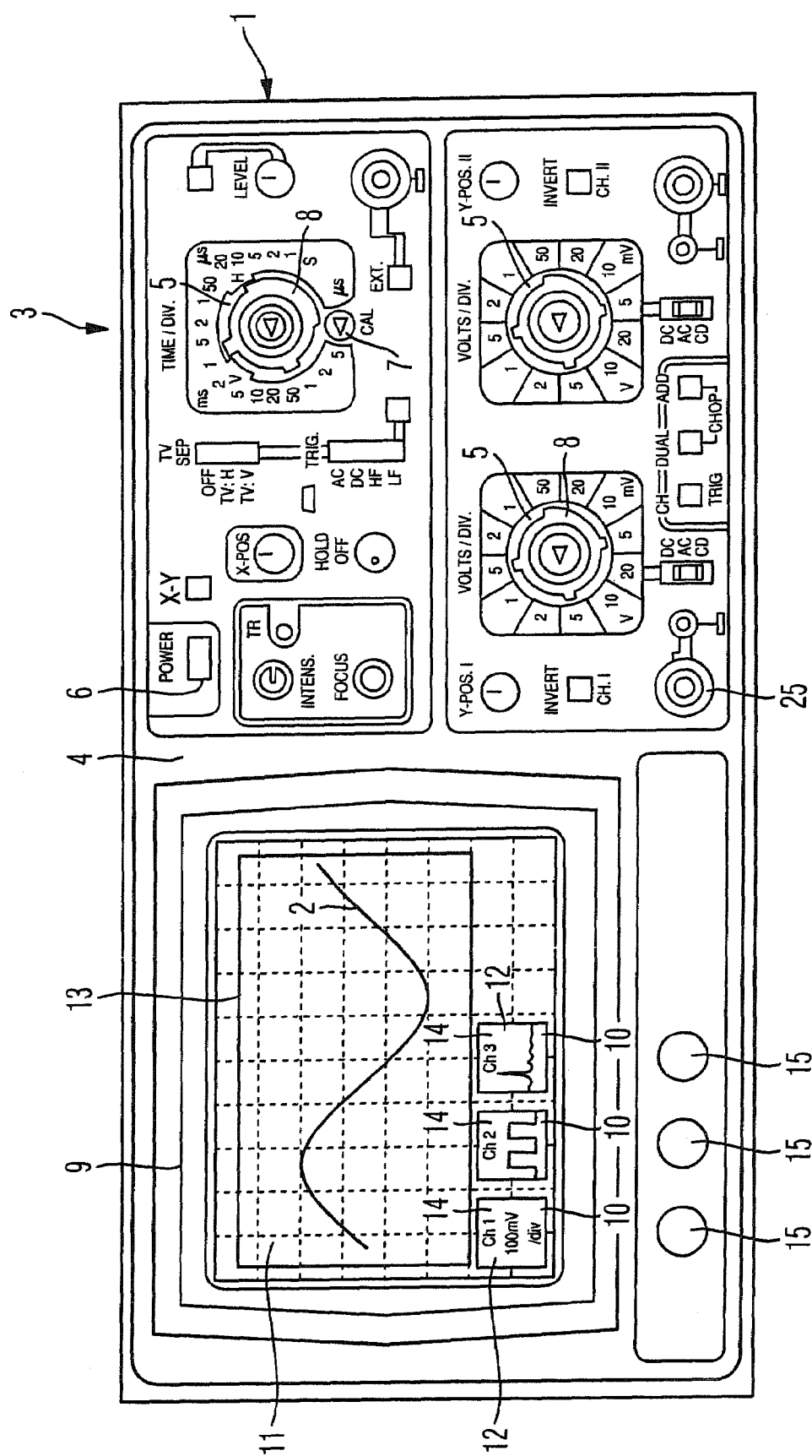
FIG. 1 shows a first exemplary embodiment of a measuring device according to the invention.

FIG. 1 shows a first exemplary embodiment of a measuring device 1 according to the invention for the display of several time-variable electrical signals 2. Although the measuring device 1 according to the invention shown in this illustration is an oscilloscope 3, the measuring device 1 according to the invention can also be, for example, a spectrum analyzer or a network analyzer.

The measuring device 1 or the oscilloscope 3 provides a front panel 4 at its side facing towards the user. Various operating elements 5, such as an on/off button 6, a toggle key 25, control buttons 7 and rotary selection switches 8 for several measurement ranges are arranged on this front panel 4. Furthermore, the front panel 4 comprises a screen 9 with several display fields 10, 11. In this context, a first display field 10 encompasses several smaller sub-fields or windows 12, while a second display field 11 is defined by a relatively-larger main window 13.

In this context, one window 12 of the first display field 10 corresponds to each measurement channel 14, so that there are the same number of windows 12 in the first display field 10 as there are measurement ports 15 either on the front panel 4 of the measuring device 1 or at another position of the measuring device 1 or respectively the oscilloscope 3 according to the invention. The measuring ports 15 in the first exemplary embodiment of the measuring device 1 according to the invention illustrated in FIG. 1 are disposed below the first display field 10, wherein the allocation of the measurement channels 14 or respectively of the measurement ports 15 to a window 12 of the first display field 10 is readily visible to the user.

Each time-variable electrical signal is presented in one of the windows 12 of the first display field 10 in the form of a "live-image" preview 2, directly as picked up from a connected sensor, which is, however, not illustrated in greater detail here. These signals 2 displayed in the smaller windows 12 can be switched to the second, relatively-larger display field 11. With the maximized display of the signal 2 in the second display field 11, a status field 16 is shown in the corresponding window 12 of the first display field 10. The status field 16 indicates, for example, waveform attributes, such as the position of a marker, volts per unit, amperes per unit, time per unit or the intensity of the signal characteristic. The time-variable electrical signals 2 are displayed in real time in both of the display fields 10, 11.

In the first exemplary embodiment of the measuring device 1 according to the invention as illustrated in FIG. 1, the screen 9 is a touch-screen or a contact-screen. Accordingly, touching the second display field 11 in the immediate vicinity of the respective signal characteristic switches off the corresponding signal 2 in the second display field 11 switching this signal 2 to the corresponding window 12 of the first display field 10 or respectively displaying it in the corresponding, relatively-smaller window 12. The corresponding status field 16 is switched off and the now minimized signal 2 continues to be displayed in real time in the corresponding window 12 of the first display field 10. The same function can also be implemented by touching the status field 16 in the first display field 10.

By way of generalization, it can therefore be stated that touching the various display fields 10, 11 on the touch-screen in each case triggers a toggle function, which either shows the signal 2 in maximized format 24 or restores it to the minimized format, wherein the toggle function applied to the first display field 10 or respectively to a window 12 of the first display field 10 alternates between a display of the status field 16 and a real-time display of the respective electrical signal 2. If the toggle function is applied to a signal 2 displayed in the second display field 11, the real-time display of this maximized electrical signal 2 is de-activated and the selected signal 2 is once again displayed in real time in the corresponding window 12 of the first display field 10 in minimized format.

Figure 2:
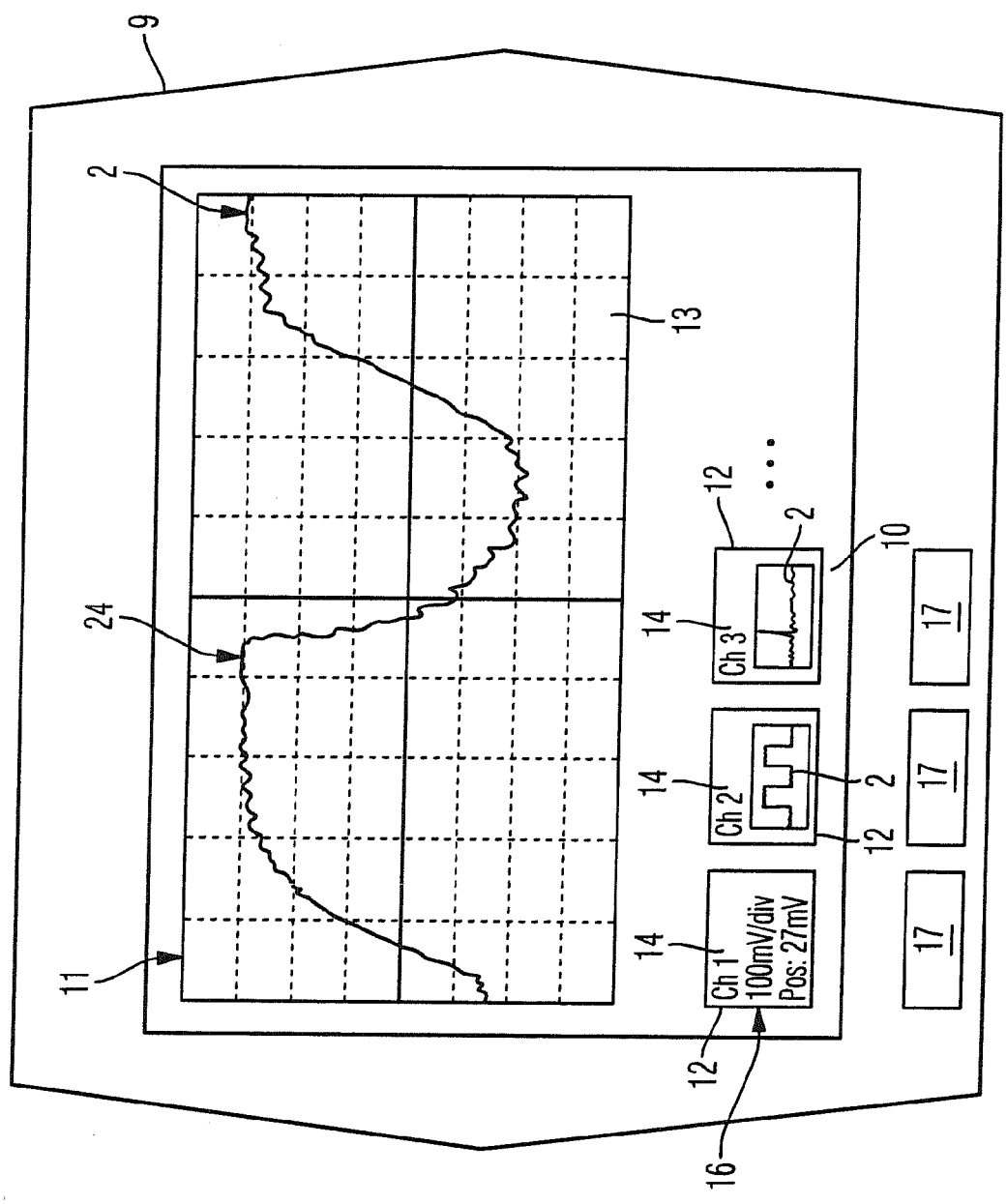
FIG. 2 shows the screen area of a second exemplary embodiment of a measuring device according to the invention.

FIG. 2 shows only the screen area of a second exemplary embodiment of the measuring device 1 according to the invention, wherein additional operating elements in the form of pushbuttons 17 are arranged below the first display field 10, and a function of a given pushbutton 17 relates to the window 12 of the first display field 10, which is disposed immediately above this pushbutton 17.

Activating the selected pushbutton 17 triggers a toggle function, wherein the toggle function of the selected pushbutton 17, which is allocated to a window 12 of the first display field 10, alternates between a display of the status field 16 and a real-time display of the electrical signal 2 in the respective window 12 of the first display field 10.

With the toggle function of the screen 9, especially the touch-screen, within the second display field 11, touching the screen 9 in the immediate vicinity of a displayed signal 2 de-activates the real-time display of this signal, causing this selected signal 2 to disappear from the screen 9.

Figure 3:
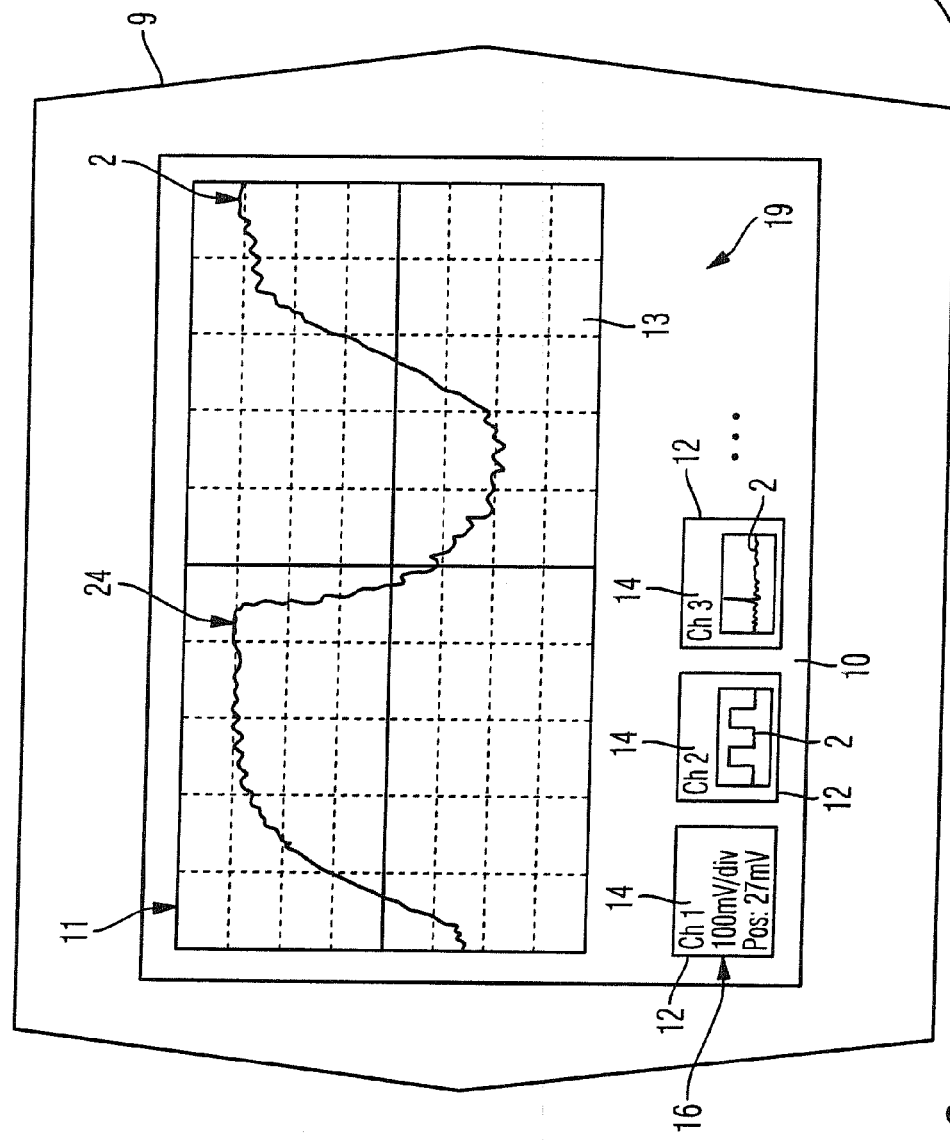
FIG. 3 shows the screen area of a third exemplary embodiment.
Figure 4:
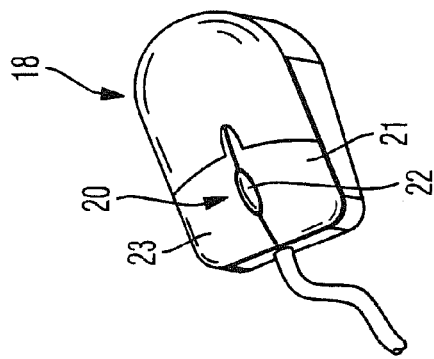
FIG. 4 shows a conventional activation mouse.

FIG. 3 shows the screen area of a third exemplary embodiment of the measuring device according to the invention, wherein the operating elements 5 are supplemented by a conventional computer mouse 18 shown in FIG. 4. The computer mouse 18, which is connected to a mouse port of the measuring device 1, which is not illustrated, provides a mouse function with a mouse pointer 19 which can be displaced on the screen. Furthermore, on its side facing towards the user, the mouse provides three pressure switches 20 or mouse keys, each of which can be defined with two functions—double-click or single click.

If the mouse pointer 19, which can be displaced over the screen 9, is disposed in the first display field 10 or the second display field 11, a single activation of the left-hand pressure switch 21 triggers a toggle function. If the mouse pointer 19 points to the respective window 12 in the first display field 10 during the activation, for example, of the left-hand pressure switch 21, this toggle function alternates between a display of the status field 16 and a real-time display of the corresponding electrical signal 2.

When the mouse pointer 19 is disposed within the second display field 11, the toggle function, for example, of the left-hand pressure switch 21 of the mouse function, causes the real-time display of the maximized electrical signal 2 to be de-activated, if the mouse pointer points to the displayed signal 2 or its immediate vicinity during the activation of the left-hand pressure switch 21.

Moreover, the remaining functionalities of the pressure switches of the mouse function can be specified in a user-defined manner with application functions of the measuring device 1 according to the invention. For example, a double click of the middle or right-hand pressure switch 22, 23 could buffer the selected signal 2 or the marked signal portion; or a single click of the middle or right-hand pressure switch could activate a triggering. Pressing the right-hand or middle pressure switch 22, 23 of the computer mouse 18 could be used, for example, to mark a signal portion.

The invention is not restricted to the exemplary embodiment presented in the drawings, in particular, the invention is not restricted to an oscilloscope 3. The invention is indeed also applicable to measuring devices, which display time-variable electrical signals in the frequency domain, such as real-time spectrum analyzers. If several second display fields are provided, it is meaningful to be able to select that display field of the several second display fields, on which the measurement signal of a window provided in the first display field should be displayed after it has been selected. This selection could be made via a keyboard. However, it is more advantageous, if the corresponding window is displaced using a mouse or on a touch-screen with the user's finger into the display field, in which it is to be displayed. A simple and effective allocation of the measurement signals to the different display fields can be achieved in this manner. All of the features described above and illustrated in the drawings can be combined with one another as required.

The invention claimed is:

1. A device, comprising:
a screen, which provides several display fields,
wherein a first display field provides at least one window, which is allocated to a given measurement channel,
wherein a first time-variable electrical signal is presented in this first display field and can be switched as a maximized display to a second display field, wherein, for each signal presented in maximized format in the second display field, a corresponding status field is displayed in the first display field,
wherein the screen is a touch-screen,
wherein touching the various display fields triggers a toggle function, and
wherein the toggle function alternates between a display of the status field and a display of the first time-variable electrical signal upon manipulation of a toggle key.

2. The device according to claim 1, wherein the time-variable electrical signal is presented in both display fields in real time.

3. The device according to claim 2, wherein the toggle function de-activates a display of a maximized electrical signal and presents the first time-variable electrical signal in a corresponding window of the first display field.

4. The device according to claim 3, wherein operating elements are present, which are disposed beneath the screen, wherein a functionality of the operating elements relates to that window of the first display field, which is disposed above a corresponding pushbutton.

5. The device according to claim 4, wherein an activation of a selected operating element triggers a toggle function.

6. The device according to claim 2, wherein operating elements are present, which are disposed beneath the screen, wherein a functionality of the operating elements relates to that window of the first display field, which is disposed above a corresponding pushbutton.

7. The device according to claim 6, wherein an activation of a selected operating element triggers a toggle function.

8. The device according to claim 1, wherein the toggle function de-activates a display of a maximized electrical signal and presents the first time-variable electrical signal in a corresponding window of the first display field.

9. The device according to claim 8, wherein operating elements are present, which are disposed beneath the screen, wherein a functionality of the operating elements relates to that window of the first display field, which is disposed above a corresponding pushbutton.

10. The device according to claim 9, wherein an activation of a selected operating element triggers a toggle function.

11. The device according to claim 1, wherein operating elements are present, which are disposed beneath the screen, wherein a functionality of the operating elements relates to that window of the first display field, which is disposed above a corresponding pushbutton.

12. The device according to claim 11, wherein an activation of a selected operating element triggers a toggle function.

13. The device according to claim 12, wherein the toggle function of a selected pushbutton, which is allocated to a window of the first display field, alternates between a display of the status field and a display of the of several time-variable electrical signals.

14. The device according to claim 1, further comprising:
a mouse and a mouse function with a mouse pointer displaced on the screen.

15. The device according to claim 14, wherein the mouse provides at least one pressure switch.

16. The device according to claim 15, wherein a single activation of the at least one pressure switch triggers a toggle function.

17. The device according to claim 16, wherein the toggle function of the at least one pressure switch of the mouse alternates between a display of the status field and a display of a respective time-variable electrical signal, if the mouse pointer points to a corresponding window of the first display field during the single activation of the at least one pressure switch.

18. The device according to claim 16, wherein the toggle function of the at least one pressure switch of the mouse de-activates a display of a maximized time-variable electrical signal in the second display field, if the mouse pointer points to a second time-variable electrical signal presented in the second display field during the single activation of the at least one pressure switch.

19. The device according to claim 16, wherein the functionalities of the at least one pressure switch of the mouse function can be specified in a user-defined manner with application functions of the device.

20. The device according to claim 1, wherein the device is an oscilloscope or a spectrum analyzer or a network analyzer.

* * * * *